(12) United States Patent
Mojumder et al.

(10) Patent No.: US 10,141,317 B2
(45) Date of Patent: Nov. 27, 2018

(54) METAL LAYERS FOR A THREE-PORT BIT CELL

(71) Applicant: QUALCOMM Incorporated, San Diego, CA (US)

(72) Inventors: Niladri Narayan Mojumder, San Diego, CA (US); Ritu Chaba, San Diego, CA (US); Ping Liu, San Diego, CA (US); Stanley Seungchul Song, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/347,530

(22) Filed: Nov. 9, 2016

(65) Prior Publication Data

US 2017/0062439 A1 Mar. 2, 2017

Related U.S. Application Data

(62) Division of application No. 14/620,480, filed on Feb. 12, 2015, now Pat. No. 9,524,972.

(51) Int. Cl.
*H01L 27/11* (2006.01)
*G11C 8/14* (2006.01)
(Continued)

(52) U.S. Cl.
CPC ............ *H01L 27/1104* (2013.01); *G11C 8/14* (2013.01); *G11C 8/16* (2013.01); *G11C 11/418* (2013.01);
(Continued)

(58) Field of Classification Search
CPC .. H01L 27/1104; H01L 27/11; H01L 27/0207; H01L 23/5226; H01L 23/528; H01L 21/3213; H01L 21/76897; G11C 8/14; G11C 8/16; G11C 11/418; G11C 11/419
See application file for complete search history.

(56) References Cited

U.S. PATENT DOCUMENTS 6,711,086 B2    3/2004  Terada
7,057,963 B2 *  6/2006  Yang ........................ G11C 8/16
                                                    365/185.13
(Continued)

FOREIGN PATENT DOCUMENTS

CN      102385908 A    3/2012
JP      2011054271 B2  3/2011

OTHER PUBLICATIONS

International Search Report and Written Opinion—PCT/US2015/062644—ISA/EPO—dated Mar. 7, 2016.
(Continued)

*Primary Examiner* — Michael Trinh
(74) *Attorney, Agent, or Firm* — Qualcomm Incorporated-Toler

(57) ABSTRACT

An apparatus includes a first metal layer coupled to a bit cell. The apparatus also includes a third metal layer including a write word line that is coupled to the bit cell. The apparatus further includes a second metal layer between the first metal layer and the third metal layer. The second metal layer includes two read word lines coupled to the bit cell.

17 Claims, 8 Drawing Sheets

(51) Int. Cl.
    *G11C 11/418*     (2006.01)
    *H01L 27/02*     (2006.01)
    *H01L 21/3213*     (2006.01)
    *H01L 21/768*     (2006.01)
    *H01L 23/522*     (2006.01)
    *H01L 23/528*     (2006.01)
    *G11C 8/16*     (2006.01)
    *G11C 11/419*     (2006.01)

(52) U.S. Cl.
    CPC ........ *G11C 11/419* (2013.01); *H01L 21/3213* (2013.01); *H01L 21/76897* (2013.01); *H01L 23/528* (2013.01); *H01L 23/5226* (2013.01); *H01L 27/0207* (2013.01); *H01L 27/11* (2013.01)

(56) References Cited

U.S. PATENT DOCUMENTS

| | | | |
|---|---|---|---|
| 7,324,382 | B2 | 1/2008 | Kuo |
| 7,738,312 | B2 * | 6/2010 | Shimano ................ G11C 5/063 365/207 |
| 8,437,166 | B1 | 5/2013 | Huang et al. |
| 8,508,986 | B2 | 8/2013 | Tanizaki et al. |
| 8,675,397 | B2 | 3/2014 | Liaw |
| 8,929,130 | B1 | 1/2015 | Liaw |
| 8,934,287 | B2 | 1/2015 | Liaw |
| 9,202,557 | B2 | 12/2015 | Wang et al. |
| 9,281,311 | B2 | 3/2016 | Wu et al. |
| 9,368,443 | B1 | 6/2016 | Tao et al. |
| 2001/0043487 | A1 | 11/2001 | Nii et al. |
| 2005/0124095 | A1 | 6/2005 | Liaw et al. |
| 2008/0291767 | A1 | 11/2008 | Barnes et al. |
| 2013/0083591 | A1 | 4/2013 | Wuu et al. |
| 2016/0019946 | A1 | 1/2016 | Lin et al. |
| 2016/0064067 | A1 | 3/2016 | Mojumder et al. |
| 2016/0141021 | A1 * | 5/2016 | Mojumder ............ G11C 11/419 365/154 |
| 2016/0163714 | A1 * | 6/2016 | Mojumder ............. G11C 5/063 257/773 |
| 2016/0181255 | A1 * | 6/2016 | Nii ...................... H01L 27/1104 257/369 |
| 2016/0240539 | A1 | 8/2016 | Mojumder |

OTHER PUBLICATIONS

Sinha S., et al., "Exploring sub-20nm FinFET design with Predictive Technology Models," Design Automation Conference (DAC), 2012 49TH ACM/EDAC/IEEE, IEEE, Jun. 3, 2012 (Jun. 3, 2012), pp. 283-288, XP032204602, ISBN: 978-1-4503-1199-1.

* cited by examiner

METAL LAYERS FOR A THREE-PORT BIT CELL

I. CROSS REFERENCE TO RELATED APPLICATIONS

The present application claims priority from and is a divisional application of pending U.S. patent application Ser. No. 14/620,480, now U.S. Pat. No. 9,524,972, filed Feb. 12, 2015, entitled "METAL LAYERS FOR A THREE-PORT BIT CELL," the content of which is incorporated by reference herein in its entirety.

II. FIELD

The present disclosure is generally related to bit cells.

III. DESCRIPTION OF RELATED ART

Advances in technology have resulted in smaller and more powerful computing devices. For example, there currently exist a variety of portable personal computing devices, including wireless telephones, such as mobile and smart phones, tablets, and laptop computers, which are small, lightweight, and easily carried by users. These devices can communicate voice and data packets over wireless networks. Further, many such devices incorporate additional functionalities such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices, such as wireless telephones, may include memories that include a memory array including one or more memory cells. One type of memory cell that may be used for the memory (e.g., L1/L2 cache) is a 3-port bit cell. A 3-port bit cell may include two read ports and one write port, and may be used in static random access memory (SRAM) devices. A 3-port SRAM bit cell may be manufactured using a two-mask litho-etch-litho-etch (LELE) process by overlaying two metal layers, referred to as M1 and M2 layers. The top metal layer, M2, may be patterned in a non-linear fashion and may include "jogs" (e.g., turns). For manufacturing very small scale devices, self-aligned double patterning (SADP) may be preferable to LELE, due to decreased cost and improved process control (e.g., more precise line width and line spacing control) provided by SADP as compared to LELE. However, SADP may not support non-linear patterns that include jogs.

IV. SUMMARY

The present disclosure provides a bit cell design that include linear patterns that are compatible with SADP, such as for technology nodes smaller than 14 nm (e.g., 10 nm or 7 nm). A 3-port bit cell may have a first metal layer (M1) that has a length perpendicular to a length of poly-gates in the bit cell, a second metal layer (M2) that has a length parallel to the length of the poly-gates, and a third metal layer (M3) that has a length parallel to the length of the poly-gates. Because the first metal layer (M1) and the second metal layer (M2) are oriented in a similar direction as corresponding metal layers in a "standard bit cell", the first metal layer (M1) and the second metal layer (M2) may have a relatively low pitch (e.g., a pitch that is approximately 42 nm). Because the third metal layer (M3) is oriented in an opposite direction as a third metal layer in a standard bit cell, the third metal layer may have a relatively high pitch (e.g., a pitch that is approximately 126 nm).

Two read word lines may be formed by the second metal layer (M2) and a single write word line may be formed by the third metal layer (M3). A width of the single write word line of the third metal layer (M3) may be relatively large (e.g., approximately 66 nm (contacted poly pitch (CPP) for a 10 nm process)), which may result in reduced latency and reduced resistor-capacitor (RC) delay compared to a latency of a write word line formed in a layer with the read word lines. Additionally, because the second metal layer (M2) has a relatively small pitch, two relatively narrow read word lines (e.g., approximately 23 nm per read word line) may be included in the second metal layer without having to expand the width of the cell past 2*CPP for a 10 nm process.

In a particular embodiment, an apparatus includes a first metal layer coupled to a bit cell. The apparatus also includes a third metal layer including a write word line that is coupled to the bit cell. The apparatus further includes a second metal layer between the first metal layer and the third metal layer. The second metal layer includes two read word lines coupled to the bit cell.

In another particular embodiment, a method includes patterning a first metal layer at a bit cell and patterning a third metal layer. The third metal layer includes a write word line coupled to the bit cell. The method also includes patterning a second metal layer between the first metal layer and the third metal layer. The second metal layer includes two read word lines coupled to the bit cell.

In another particular embodiment, a non-transitory computer-readable medium includes instructions that, when executed by a processor, cause the processor to initiate patterning of a first metal layer at a bit cell and initiate patterning of a third metal layer. The third metal layer includes a write word line coupled to the bit cell. The instructions are also executable to cause the processor to initiate patterning of a second metal layer between the first metal layer and the third metal layer. The second metal layer includes two read word lines coupled to the bit cell.

In another particular embodiment, an apparatus includes first means for routing current coupled to a bit cell and third means for routing current. The third means for routing current includes a write word line coupled to the bit cell. The apparatus also includes second means for routing current between the first means for routing current and the third means for routing current. The second means for routing lines includes two read word lines coupled to the bit cell.

One particular advantage provided by at least one of the disclosed embodiments is reduced latency and reduced resistor-capacitor (RC) delay based on a relatively large width of a write word line. For example, providing the write word line in a third metal layer (as opposed to providing two read word lines in the third metal layer) may enable the write word line to have a relatively large width. Additionally, because a length of a second metal layer is parallel to a length of poly-gates, the two read word lines may be provided in the second metal layer without increasing a width of a bit cell. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Scaling down from 14 nm technology may present challenges. For example, for technology nodes 14 nm and larger, the width of a 3-port bit cell may be restricted to being less than or equal to twice contacted poly pitch (CPP, the distance between contacted poly (gate) lines). For 14 nm, CPP may be approximately 80-90 nm. As used herein, cell "width" may be perpendicular to a poly direction and along a fin direction. For technology nodes smaller than 14 nm, CPP is reduced, which results in decreased bit cell width. When the bit cell width is reduced (i.e., narrowed), write and read word lines in the bit cell may also be narrowed, resulting in increased read/write latency due to increased word line resistor-capacitor (RC) impedance.

To maintain relatively wide spacing of write and read word lines, conventional bits cells may additionally include a third metal layer, M3, formed above M2 using SADP to circumvent restrictions associated with the bit cell. For the conventional bit cell, M3 may include two read word lines, and M2 may include a write word line. When the bit cell is formed, adjacent metal layers of the bit cell are laid out in opposite directions. For example, if M1 is horizontal, M2 is vertical, and M3 is horizontal. Typically, M1 is perpendicular to a direction of poly-gates of the bit cell. Additionally, the metal layers that include the read and write word lines (e.g., M2 and M3) are typically in the same direction as the poly-gates. Thus, if the poly-gates are in the vertical direction, M1 is in the horizontal direction (e.g., perpendicular to the poly-gate direction), and M2 and M3 are in the vertical direction. M3 is a "wrong direction layer" (e.g., a metal layer having a similar direction as the adjacent layers in the bit cell) and has a pitch that is approximately 2-3 times CPP. As a result, the width of the bit cell may increase if two lines (e.g., two read word lines) are in M3. Thus, an additional metal layer (e.g., a fourth metal layer, M4) may be required for one of the word lines, increasing size and manufacturing cost of the bit cell.

To circumvent this problem, the present disclosure provides two read word lines formed by M2 and a single write word line may be formed by M3. A width of the single write word line of M3 may be relatively large (e.g., approximately 66 nm (contacted poly pitch (CPP) for a 10 nm process)), which may result in reduced latency and reduced resistor-capacitor (RC) delay compared to a latency of a write word line formed in a layer with the read word lines.

Particular embodiments of the present disclosure are described below with reference to the drawings. In the description and the drawings, common features are designated by common reference numbers for clarity of the embodiments as depicted and described.

Figure 1A:
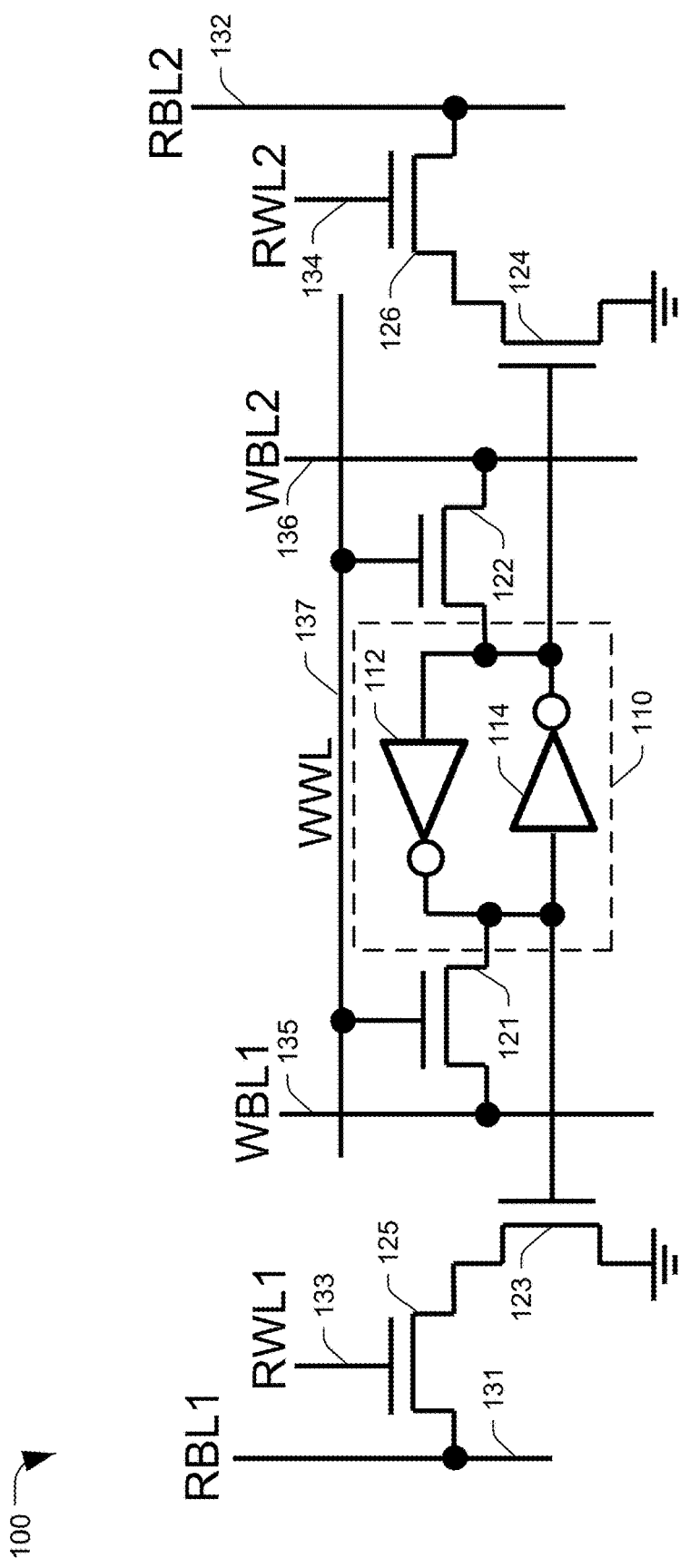
FIG. 1A and FIG. 1B are circuit diagrams of a first illustrative embodiment of a 3-port bit cell.
Figure 1B:
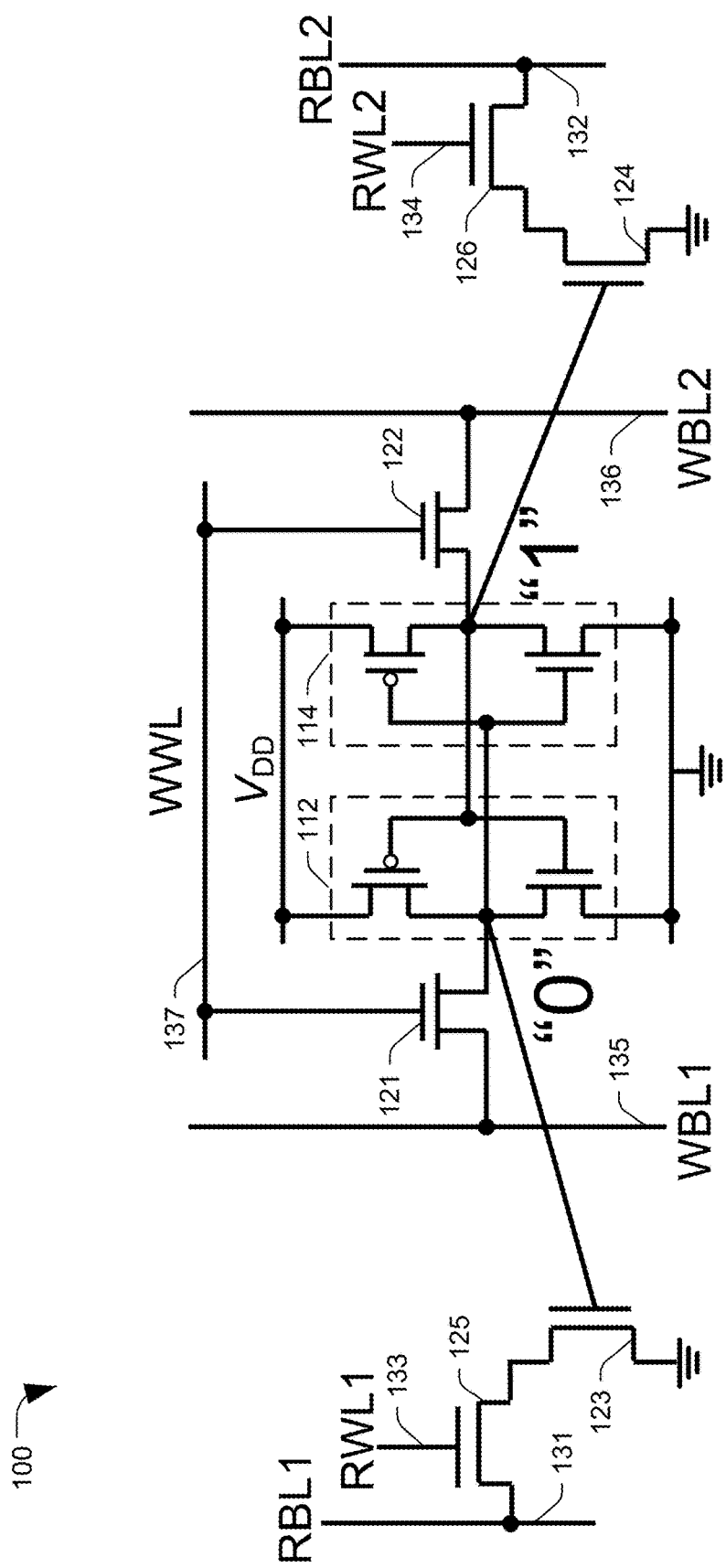

Referring to FIG. 1A and 1B, circuit diagrams of a first illustrative embodiment of a bit cell 100 are shown. The bit cell 100 includes a storage latch 110. The storage latch 110 may include a pair of cross-coupled inverters 112, 114. Each of the inverters 112, 114 may include a p-type metal oxide semiconductor (PMOS) transistor and an n-type metal oxide semiconductor (NMOS) transistor, as shown in FIG. 1B.

The storage latch 110 may be connected (e.g., coupled) to a first write transistor 121 and to a second write transistor 122. The write transistors 121, 122 may be NMOS transistors, as shown. In other embodiments, the write transistors 121, 122 may be PMOS transistors. The first write transistor 121 may be connected to a first write bit line (WBL1) 135 and to a write word line (WWL) 137, and the second write transistor 122 may be connected to a second write bit line (WBL2) 136 and to the write word line (WWL) 137. The first write transistor 121 and the second write transistor 122 may be complementary write transistors of a write port of the bit cell 100. The write port may be used to write a logic zero (e.g., low) value into the storage latch 110 when the write word line 137 and one of the write bit lines 135 or 136 are asserted. The write port may be used to write a logic one (e.g., high) value into the storage latch 110 when the write word line 137 and the other of the write bit lines 135 or 136 are asserted.

The storage latch 110 may also be connected to a first read drive transistor 123 and to a second read drive transistor 124. The first read drive transistor 123 may be connected to a first read transistor 125, and the second read drive transistor 124 may be connected to a second read transistor 126. The read drive transistors 123, 124 and the read transistors 125, 126 may be NMOS transistors, as shown. In another embodiment, the read drive transistors 123, 124 may be PMOS transistors. The first read transistor 125 may be connected to a first read bit line (RBL1) 131 and to a first read word line (RWL1) 133. The second read transistor 126 may be connected to a second read bit line (RBL2) 132 and to a second read word line (RWL2) 134. The transistors 123 and 125 may correspond to a first read port of the bit cell 100, and the transistors 124 and 126 may correspond to a second read port of the bit cell 100. The read word lines 133 and/or 134 may be asserted during a read operation, and the read ports may be complementary read ports. For example, when a data value at the first read port is logic zero, a data value at the second read port is logic one, and vice versa. In the example of FIG. 1B, the first read port (on the left) is shown as reading a logic zero value ("0") and the second read port (on the right) is shown as reading a logic one ("1") value.

The bit cell 100 may thus include two read ports and one write port, and may be referred to as a "3-port" bit cell. Because the bit cell 100 includes ten transistors, the bit cell 100 may also be referred to as a "10T" bit cell. In a particular embodiment, the bit cell 100 is included in a static random access memory (SRAM) device and provides high-speed parallel memory access. As an illustrative non-limiting example, an SRAM device that includes the bit cell 100 may be used in an L1 and/or L2 cache of a processor. The SRAM device may include one or more arrays of bit cells arranged in a grid-like fashion, including one or more rows of bit cells and one or more columns of bit cells.

Figure 2:
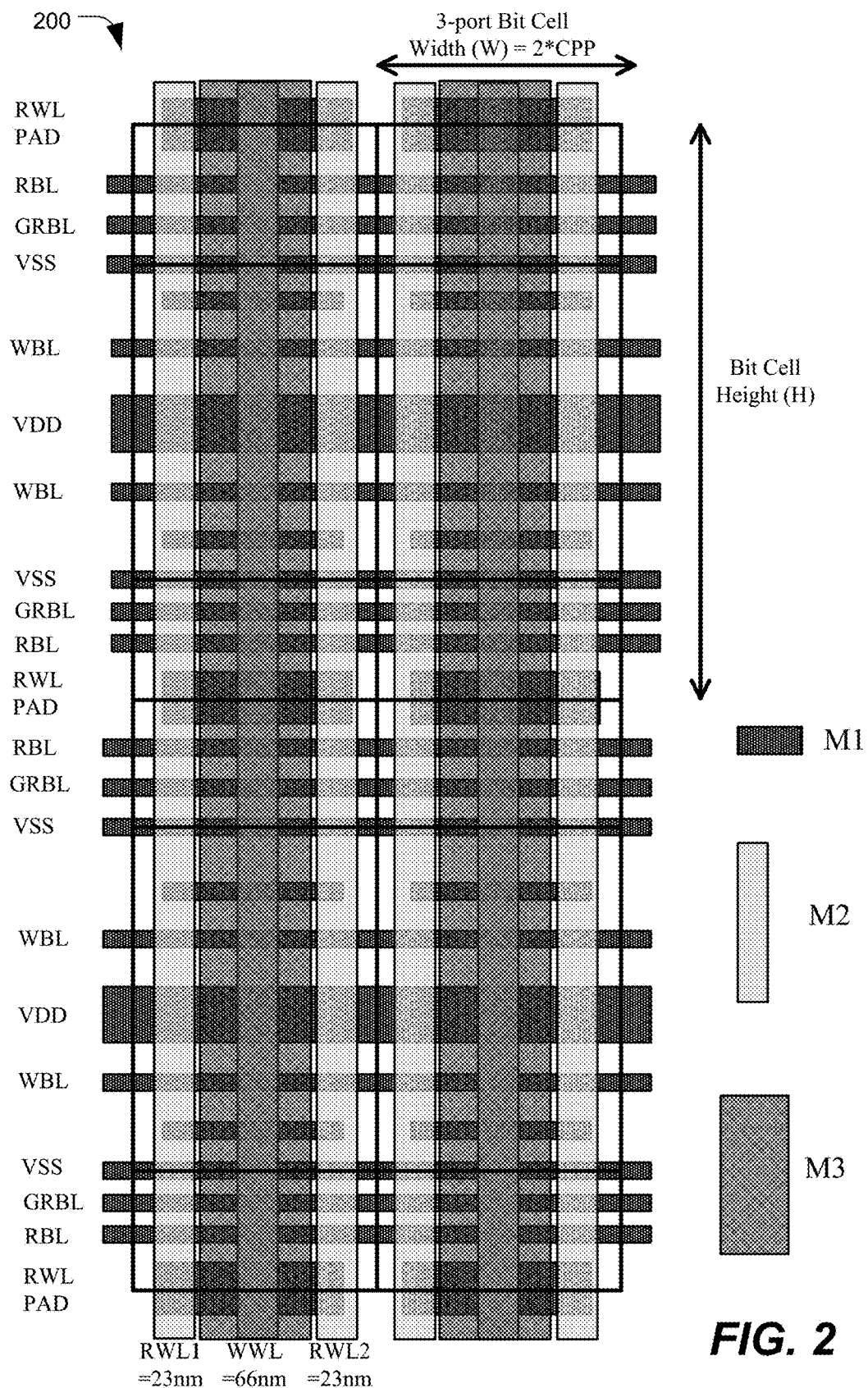
FIG. 2 is a first layout diagram of an array of 3-port bit cells.

As further described with respect to FIG. 2, the bit cell 100 may have a height (H) and a width (W). In accordance with the described techniques, the width (W) may be approximately twice a contacted poly pitch (CPP) associated with the bit cell 100, where the CPP corresponds to a distance between contacted poly (gate) lines. The CPP may alternately be referred to as gate pitch. For example, the CPP corresponds to a distance from an edge of a poly line to a corresponding edge of an adjacent poly line (e.g., top-edge to top-edge or bottom-edge to bottom-edge). The CPP may therefore also be considered as being equal to a sum of one poly width and one poly spacing. In a 10 nm semiconductor manufacturing process (e.g., a process that has a smallest available line width/feature size of 10 nm), the CPP may be approximately equal to 60-66 nm. For comparative purposes, the CPP for a 14 nm process (e.g., a process that has a smallest available line width/feature size of 14 nm) may be approximately 80-90 nm.

To maintain a bit cell width at 2*CPP or less for sub-14 nm processes (e.g., 10 nm processes or 7 nm processes), the techniques of the present disclosure (as further described with reference to FIG. 2) pattern two read word lines in a second metal layer, M2, and pattern a write word line in a third metal layer, M3. The second metal layer and the third metal layer may be coupled to the bit cell and patterned so that the lengths of the second metal layer and the third metal layer are parallel to a length of a poly-gate of the bit cell. Because the third metal layer is patterned in a direction parallel to the direction of the poly-gate (e.g., a "wrong direction layer") as opposed to a conventional third metal layer which is patterned in a direction that is perpendicular to the direction of the poly-gate (e.g., a "right direction layer"), the third metal layer may have a relatively large pitch (e.g., a pitch that is approximately 126 nm). As further described with reference to FIG. 2, the third metal layer may accommodate a relatively large single wide write word line (WWL) 137 in a bit cell having a width of 2*CPP, which may reduce latency and resistor-capacitor (RC) delay.

Additionally, the second metal layer may accommodate the two read word lines (RWL1, RWL2) 133, 134 without having to expand the width of the bit cell 100 past 2*CPP. For example, because the second metal layer is patterned in a direction that is parallel to the direction of the poly-gate (e.g., the second metal layer is a right direction layer); the second metal layer may have a relatively small pitch (e.g., a pitch that is approximately 42 nm). Based on the relatively small pitch of the second metal layer, the second metal layer may accommodate the two read word lines (RWL1, RWL2) 133, 134 without having to expand the width of the bit cell 100 past 2*CPP Referring to FIG. 2, a first layout diagram of an array of bit cells is shown and is generally designated 200. For example, FIG. 2 depicts an array of four bit cells (e.g., a 2×2 bit cell array), where each bit cell has the circuit layout shown in FIGS. 1A and 1B. When manufactured, the bit cells may include various components/layers, such as fins (FinFETs including source/drain regions), transistor gates (alternately referred to as poly lines), middle-of-line contacts (e.g., local interconnects) for transistor source/drain regions (MD), middle-of-line contacts (e.g., local interconnects) for gates/poly lines (MP), a first metal layer (M1), vias connecting MD and MP to M1 (Via0), a second metal layer (M2), vias connecting M1 to M2 (Via1), a third metal layer (M3), and vias connecting M2 to M3 (Via2).

FIG. 2 illustrates the first metal layer (M1), the second metal layer (M2), and the third metal layer (M3). The first metal layer (M1) may be coupled to the bit cells, the second metal layer (M2) may be patterned above the first metal layer (M1), and the third metal layer (M3) may be patterned above the second metal layer (M2). In the illustrative embodiment, the length of the first metal layer (M1) may be oriented in a first direction (e.g., a horizontal direction), the length of the second metal layer (M2) may be oriented in a second direction (e.g., a vertical direction), and length of the third metal layer (M3) may be oriented in the second direction. The first metal layer (M1) may include the first read bit line (RBL1) 131 of FIGS. 1A-1B, the second read bit line (RBL2) 134 of FIGS. 1A-1B, the first write bit line (WBL1) 135 of FIGS. 1A-1B, and the second write bit line (WBL2) 136 of FIGS. 1A-1B. For example, the first metal layer (M1) may include metal tracks to provide a ground voltage (VSS), metal tracks for write bit lines (WBL), metal tracks to provide a supply voltage (Vdd), metal tracks for global read bit lines (GRBL), and metal tracks for read bit lines (RBL).

In a standard bit cell that includes a poly-gate having a length oriented in the vertical direction, a first metal layer may have a length oriented in a horizontal direction (as illustrated in the embodiment of FIG. 2), a second metal layer may have a length oriented in a vertical direction (as illustrated in the embodiment of FIG. 2), and a third metal layer may have a length oriented in a horizontal direction. However, because the length of the third metal layer (M3) of FIG. 2 is oriented in the vertical direction, the third metal layer (M3) is a "wrong direction layer." Thus, the pitch of the third metal layer (M3) may be approximately equal to 126 nm). Because the first metal layer (M1) and the second metal layer (M2) of FIG. 2 are "right direction layers" (e.g., layers having lengths that are oriented in a similar manner as corresponding layers in a standard bit cell), the first metal layer (M1) and the second metal layer (M2) have a relatively low pitch (e.g., approximately equal to 42 nm).

As described with reference to FIGS. 1A-1B, when migrating from a 14 nm process to a 10 nm process, SADP may be preferable for patterning metal layers of the bit cells. Because SADP may be ill-suited for jogs/turns, the metal layers (M1, M2, and M3) of the bit cells may correspond to linear-only patterns. When using linear-only patterns at 10 nm, three independently accessible word lines (2 read word lines and 1 write word line) may be patterned in the second and third metal layers (M2, M3). For example, the two read word lines (RWL1, RWL2) 133, 134 of the bit cell 100 may be patterned in the second metal layer (M2), and the write word line (WWL) 137 of the bit cell 100 may be patterned in the third metal layer (M3).

As described above, the second metal layer (M2) is a "right direction layer" and has a relatively low pitch. Thus, the two read word lines (RWL1, RWL2) 133, 134 may be patterned in the second metal layer (M2) without expanding the width of the bit cell 100. For example, each read word line (RWL1, RWL2) 133, 134 may have a width of approximately 23 nm (satisfying the pitch requirement of the second metal layer (M2)) and may accommodate the width of the bit cell 100 (e.g., 2*CPP or 132 nm).

As described above, the third metal layer (M3) is a "wrong direction layer" and has a relatively high pitch. Thus, a single write word line (WWL) 137 may be patterned in the third metal layer (M3) without expanding the width of the bit cell 100. Because a single write word line (WWL) 137 is patterned in the third metal layer (M3) (as opposed to the two read word lines (RWL1, RWL2) 133, 134 which would increase the width of the bit cell 100), the write word line (WWL) 137 may have a relatively large width. For example, the write word line (WWL) 137 may have a width of approximately 66 nm (satisfying the pitch requirement of the third metal layer (M3)) and may accommodate the width of the bit cell 100. The relatively large width of the write word line (WWL) 137 may reduce write latency for the bit cell 100. For example, an increased width of the write word line (WWL) 137 may reduce the RC impedance of the write word line (WWL) 137, resulting in reduced latency.

The bit cells described with reference to FIGS. 1A, 1B, and 2 may be compatible with SADP metal patterning for manufacturing processes less than 14 nm (e.g., 10 nm or 7 nm). In addition, the bit cells may have an increased write word line width (compared to a write word line width of a write word line in another metal layer), which may reduce write latency. Additionally, patterning the read word lines (RWL1, RWL2) 133, 134 in the second metal layer (M2) and the write word line (WWL) 137 in the third metal layer (M3) may circumvent the need to increase the width of the bit cell 100 or use a fourth metal layer (M4) for a read word line. Thus, additional metal layers (M4, M5, M6, etc.) may be relatively "vacant" and may be used for increased routing porosity. For example, the additional metal layers may be used to interconnect other components of the bit cell 100.

Figure 3:
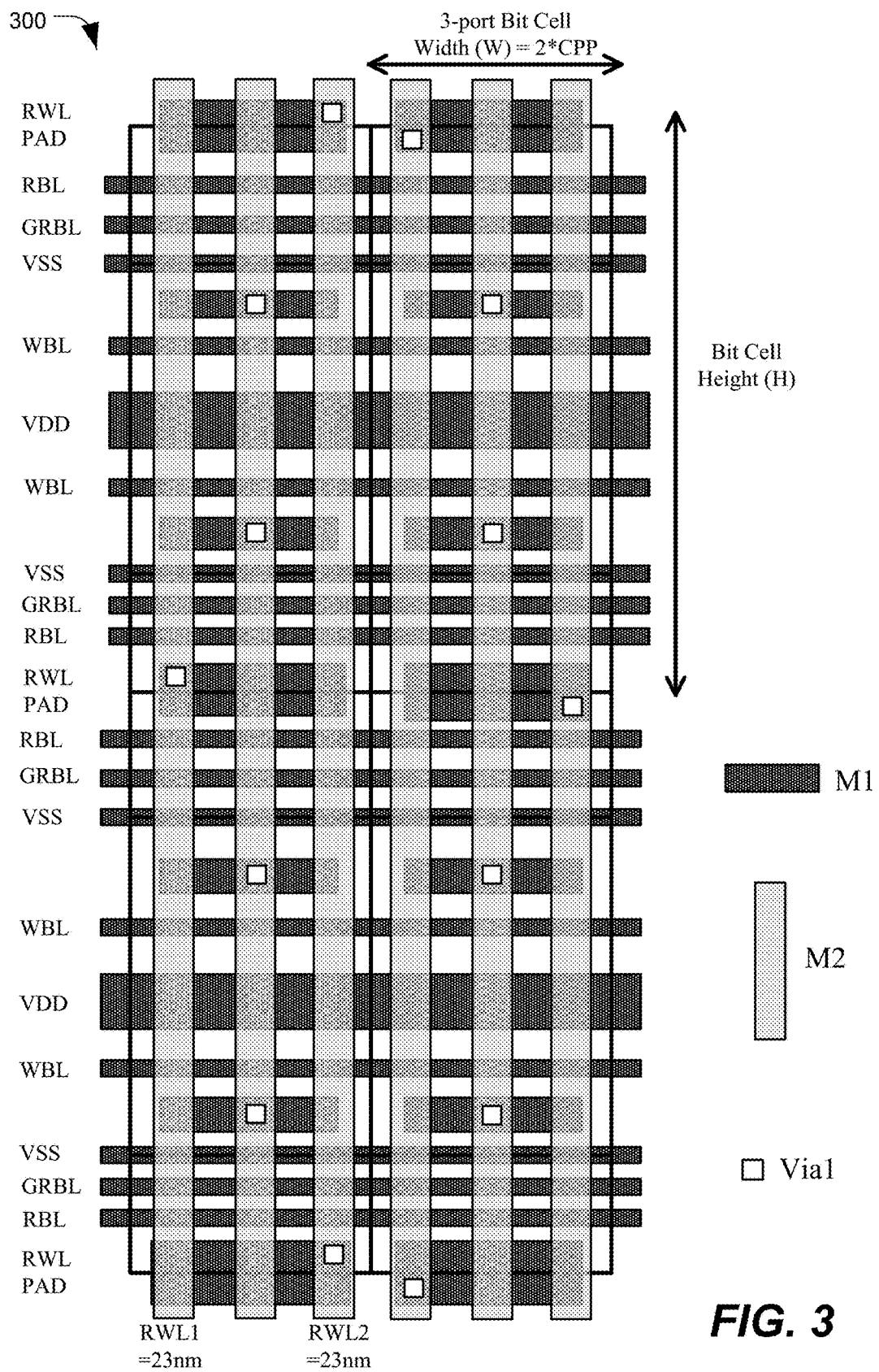
FIG. 3 is a second layout diagram of the array of 3-port bit cells.

Referring to FIG. 3, a second layout diagram of the array of bit cells is shown and is generally designated 300. The second layout diagram 300 depicts interconnections between the first metal layer (M1) of the first layout diagram 200 of FIG. 2 and the second metal layer (M2) of the first layout diagram 200.

First vias (Via1) may be formed to connect the first metal layer (M1) to the second metal layer (M2). Although SADP may be used to pattern the metal layers (M1, M2) of the bit cells in technologies less than 14 nm, LELE may be used (e.g., for cost-related and/or process-related reasons) to form the first vias (Via1) that connect the metal layers (M1, M2). Migrating to processes smaller than 14 nm may decrease the spacing between metal-metal vias in the bit cells, such as first vias (Via1) that connect the first metal layer (M1) to the second metal layer (M2). In particular, spacing between such vias may be decreased to less than 40 nm when bit cell width is fixed at 2*CPP.

Figure 4:
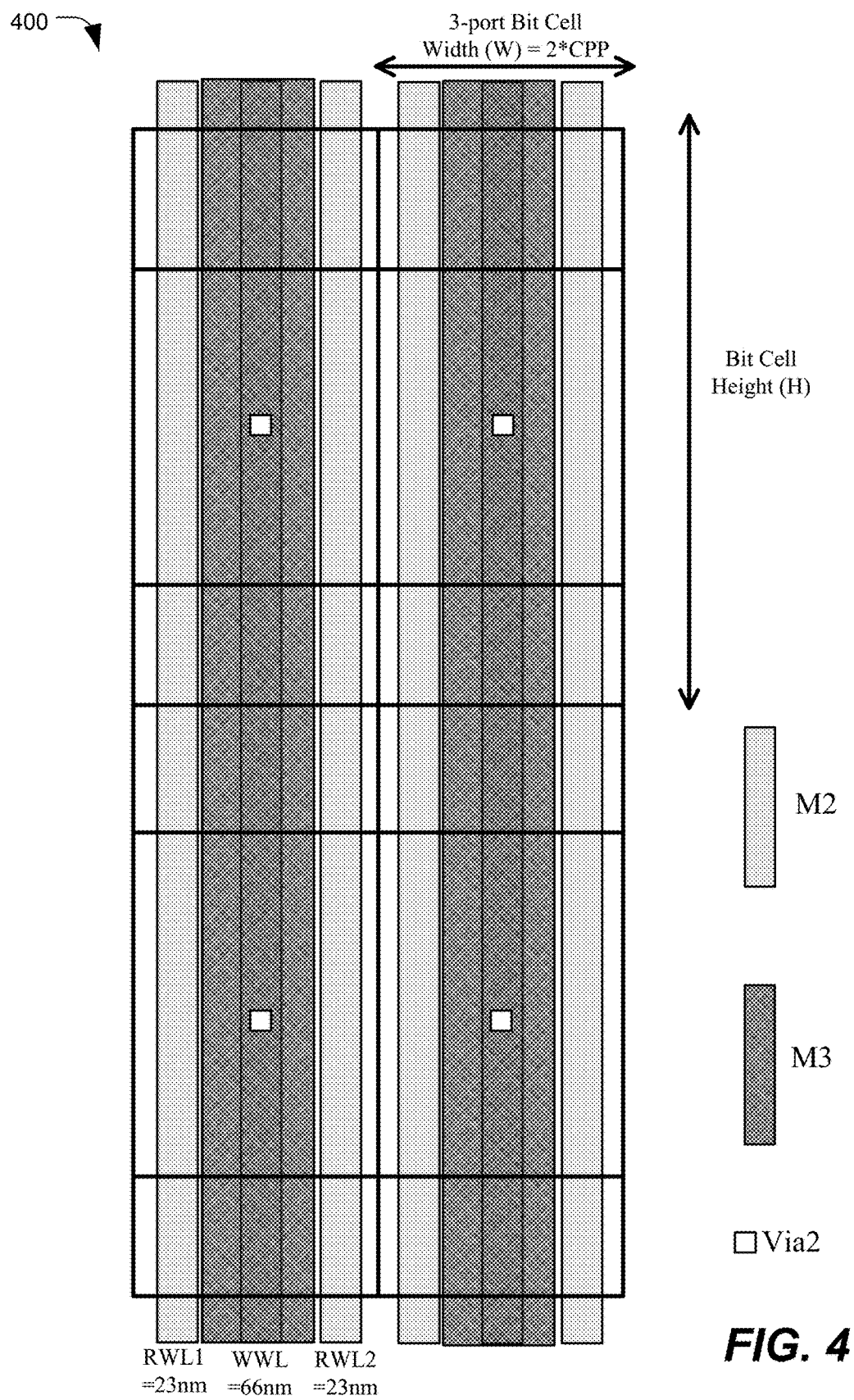
FIG. 4 is a third layout diagram of the array of 3-port bit cells.

Referring to FIG. 4, a third layout diagram of the array of bit cells is shown and is generally designated 400. The third layout diagram 400 depicts interconnections between the second metal layer (M2) of the first layout diagram 200 of FIG. 2 and the third metal layer (M3) of the first layout diagram 200.

Second vias (Via2) may be formed to connect the second metal layer (M2) to the third metal layer (M3). Although SADP may be used to pattern the metal layers (M2, M3) of the bit cell 100 in technologies less than 14 nm, LELE may be used (e.g., for cost-related and/or process-related reasons) to form the second vias (Via2) that connect the metal layers (M2, M3). Migrating to processes smaller than 14 nm may decrease the spacing between metal-metal vias in the bit cell 100, such as second vias (Via2) that connect the second metal layer (M2) to the third metal layer (M3). In particular, spacing between such vias may be decreased to less than 40 nm when bit cell width is fixed at 2*CPP.

Figure 5:
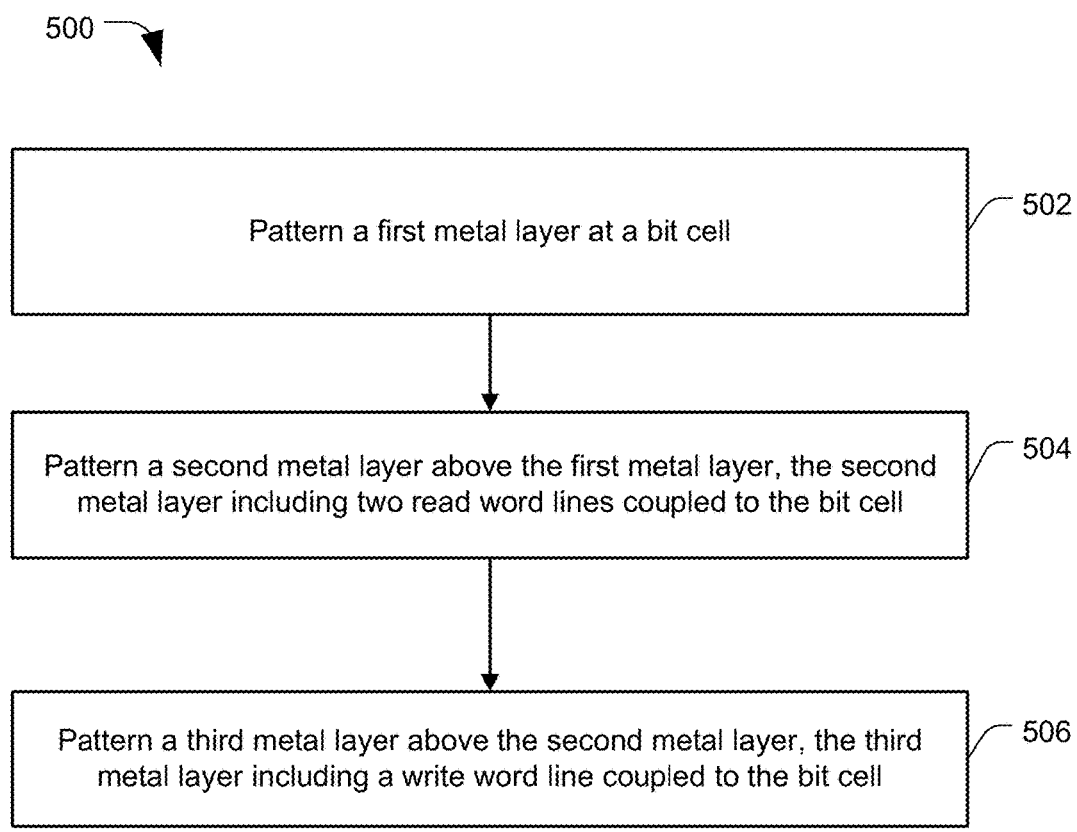
FIG. 5 is a flowchart of a particular illustrative embodiment of a method of forming a 3-port bit cell.

Referring to FIG. 5, a flowchart of a particular illustrative embodiment of a method 500 of forming a bit cell is shown and generally designated 500. In an illustrative embodiment, the method 500 may be performed during manufacturing of the bit cell 100. In a particular embodiment, the method 500 may be performed using the manufacturing equipment described below with respect to FIG. 7.

The method 500 may include patterning a first metal layer of a bit cell, at 502. For example, referring to FIG. 2, the first metal layer (M1) may be patterned at the bit cell 100. The first metal layer (M1) may include the first read bit line (RBL1), the second read bit line (RBL2), the first write bit line (WBL1), and the second write bit line (WBL2). In a particular embodiment, the first metal layer (M1) may also include lines to provide a supply voltage (Vdd) and a ground voltage (Vss).

A second metal layer may be patterned above the first metal layer, at 504. For example, referring to FIG. 2, the second metal layer (M2) may be patterned above the first metal layer (M1). The first read word line (RWL1) 133 and the second read word line (RWL2) 134 may be included in the second metal layer (M2) and may be coupled to the bit cell 100. For example, the first read word line (RWL1) 133 may be coupled to the gate of the transistor 125, and the second read word line (RWL2) 134 may be coupled to the gate of the transistor 134.

A third metal layer may be patterned above the second metal layer, at 506. For example, referring to FIG. 3, the third metal layer (M3) may be patterned above the second metal layer (M2). The write word line (WWL) 137 may be included in the third metal layer (M3) and may be coupled to the bit cell 100. For example, the write word line (WWL) 137 may be coupled to the gate of the transistor 121 and to the gate of the transistor 122.

In a particular embodiment, the method 500 may include forming a first via that connects the first metal layer to the second metal layer. For example, referring to FIG. 3, the first vias (Via1) may be formed (after formation of the first metal layer (M1)) to connect the first metal layer (M1) to the second metal layer (M2). LELE may be used (e.g., for cost-related and/or process-related reasons) to form the first vias (Via1) that connect the metal layers (M1, M2).

In a particular embodiment, the method 500 may include forming a second via that connects the second metal layer to the third metal layer. For example, referring to FIG. 4, the second vias (Via2) may be formed (after formation of the second metal layer (M2)) to connect the second metal layer (M2) to the third metal layer (M3). LELE may be used (e.g., for cost-related and/or process-related reasons) to form the second vias (Via2) that connect the metal layers (M2, M3).

In a particular embodiment, the method 500 may include patterning a fourth metal layer above the third metal layer. For example, a fourth metal layer (M4) may be formed above the third metal layer (M3) and may be coupled to the bit cell 100. A length of the fourth metal layer (M4) may be oriented in the vertical direction (e.g., the fourth metal layer (M4) may be a right direction layer) and may the fourth metal layer (M4) may have a pitch approximately equal to 80 nm. A write global word line may be included in the fourth metal layer (M4).

The method 500 of FIG. 5 enables metal layers to be formed at the bit cell 100 that are compatible with SADP metal patterning for manufacturing processes less than 14 nm (e.g., 10 nm or 7 nm). In addition, the bit cell 100 may have an increased write word line width, which may reduce write latency. For example, including the write word line (WWL) 137 in the third metal layer (M3) may enable formation of a relatively wide (e.g., 66 nm) write word line (WWL) 137. Additionally, patterning the read word lines (RWL1, RWL2) 133, 134 in the second metal layer (M2) and the write word line (WWL) 137 in the third metal layer (M3) may circumvent increasing the width of the bit cell 100 or use the fourth metal layer (M4) for a read word line. Thus, additional metal layers (M4, M5, M6, etc.) may be relatively "vacant" and may be used for increased routing porosity.

It should be noted that the order of steps illustrated in FIG. 5 is for illustrative purposes only, and is not to be considered limiting. In alternative embodiments, certain steps may be performed in a different order and/or may be performed concurrently (or at least partially concurrently).

The method 500 may be implemented by a processing unit such as a central processing unit (CPU), a controller, another hardware device, firmware device, or any combination thereof. As an example, the method 500 can be performed by a processor that executes instructions, as described with respect to FIG. 7.

Figure 6:
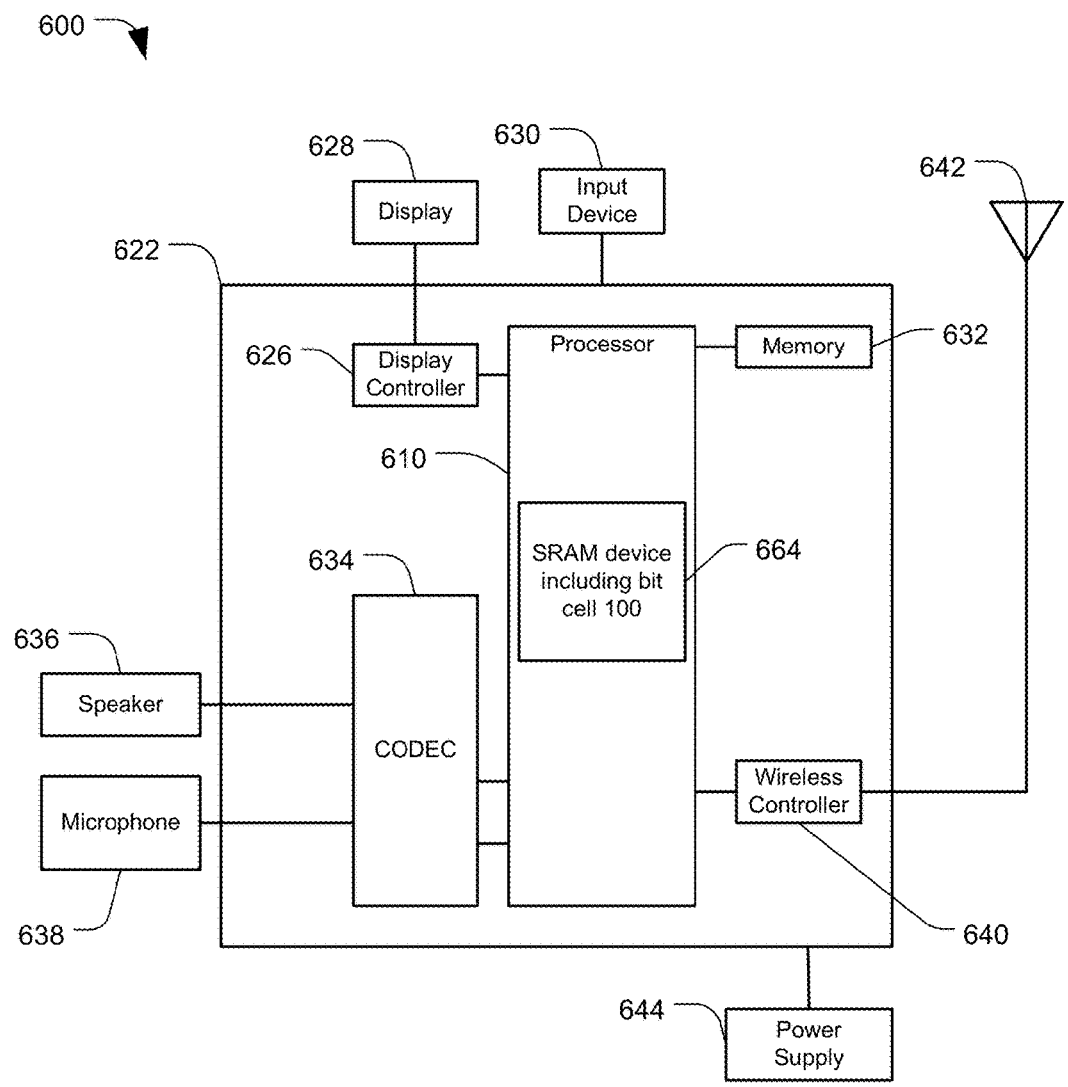
FIG. 6 is a block diagram of an electronic device including the 3-port bit cell of FIG. 1.

Referring to FIG. 6, a block diagram of a particular illustrative embodiment of an electronic device is depicted and generally designated 600. The electronic device 600 includes a processor 610, such as a digital signal processor (DSP) or a central processing unit (CPU), coupled to a memory 632. The processor 610 includes an SRAM device 664, where the SRAM device includes the bit cell 100 according to the metal layer patterning techniques described with respect to FIGS. 2-4. For example, the SRAM device 664 may correspond to L1 and/or L2 cache memory. In an illustrative embodiment, the bit cells of the SRAM device 664 may be manufactured according to the method 500 of FIG. 5. In an alternative embodiment, the SRAM device 664 may be external to and/or coupled to the processor 610. It should be noted that although FIG. 6 illustrates use of the bit cell 100 in SRAM of a particular electronic device, this is not to be considered limiting. Bit cells in accordance with the present disclosure, such as the bit cell 100, may be included in any type of memory of any type of electronic device.

FIG. 6 shows a display controller 626 that is coupled to the processor 610 and to a display 628. A coder/decoder (CODEC) 634 can also be coupled to the processor 610. A speaker 636 and a microphone 638 can be coupled to the CODEC 634. FIG. 6 also indicates that a wireless controller 640 can be coupled to the processor 610 and to an antenna 642. In a particular embodiment, the processor 610, the display controller 626, the memory 632, the CODEC 634, and the wireless controller 640 are included in a system-in-package or system-on-chip device (e.g., mobile station modem (MSM)) 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as an interface or a controller.

In conjunction with the described embodiments, an apparatus include first means for routing current coupled to a bit cell. For example, the first means for writing current may include the first metal layer (M1) of FIGS. 2-3, one or more other devices configured to route lines in a bit cell, or any combination thereof. The first means for routing lines may include the first read bit line (RBL1), the second read bit line (RBL2), the first write bit line (WBL1), and the second write bit line (WBL2). In a particular embodiment, the first means for routing current may also provide lines for providing a supply voltage (Vdd) and a ground voltage (Vss).

The apparatus may also include second means for routing current above the first means for routing current. For example, the second means for routing current may include the second metal layer (M2) of FIGS. 2-4, one or more other devices configured to route lines in a bit cell, or any combination thereof. The second means for routing current may include the first read word line (RWL1) 133 that is coupled to the bit cell 100 and the second read word line (RWL2) 134 that is coupled to the bit cell 100.

The apparatus may also include third means for routing current above the second means for routing current. For example, the third means for routing current may include the third metal layer (M3) of FIGS. 2 and 4, one or more other devices configured to route lines in a bit cell, or any combination thereof. The third means for routing current may include the write word line (WWL) 137 that is coupled to the bit cell 100.

Figure 7:
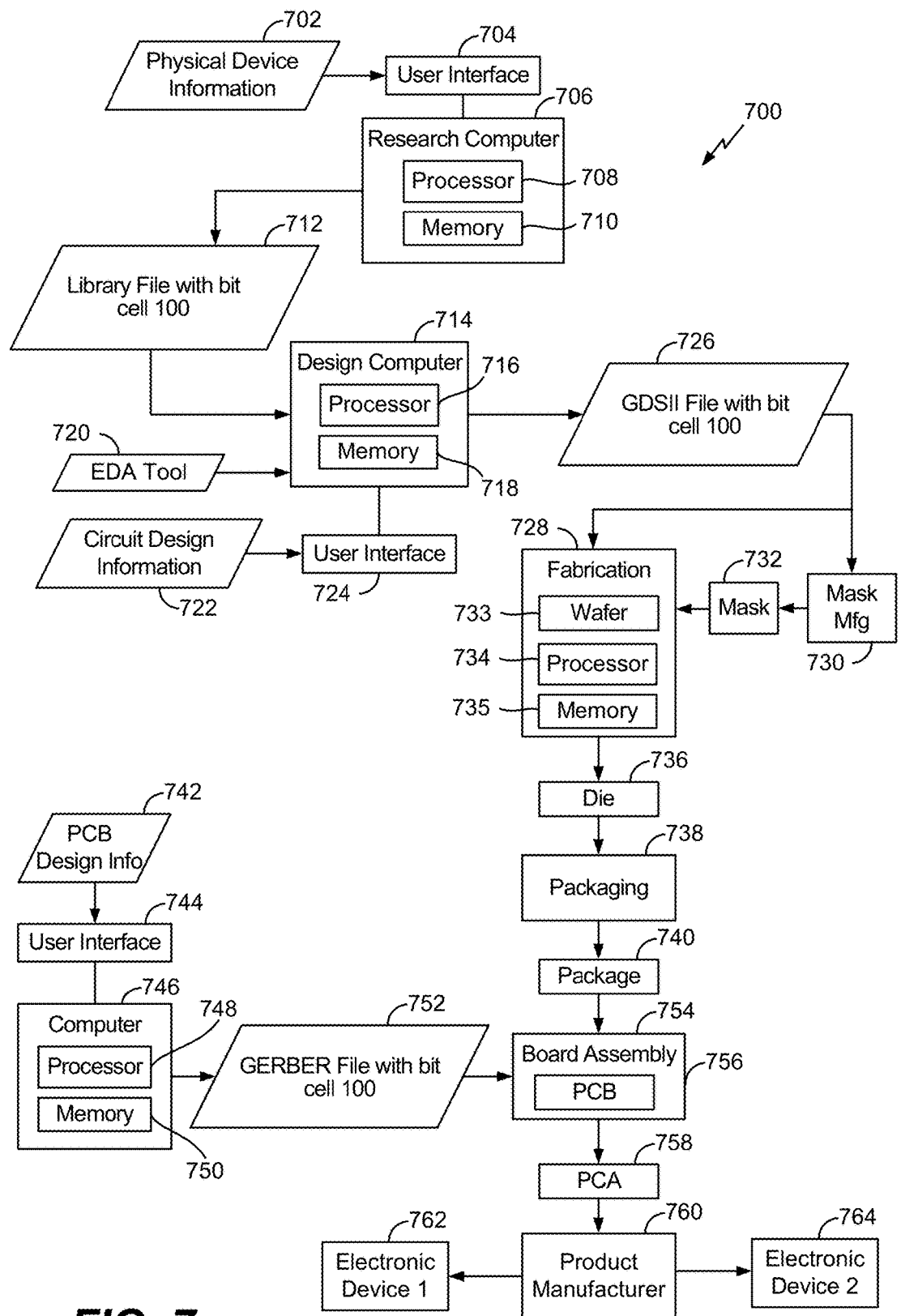
FIG. 7 is a data flow diagram of a particular illustrative embodiment of a manufacturing process to manufacture electronic devices that include the 3-port bit cell of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips may be employed in electronic devices. FIG. 7 depicts a particular illustrative embodiment of an electronic device manufacturing process 700. For example, the manufacturing process 700 may be used to manufacture electronic devices that include the bit cell 100 according to the metal layer patterning techniques described with respect to FIGS. 2-4.

Physical device information 702 is received at the manufacturing process 700, such as at a research computer 706. The physical device information 702 may include design information representing at least one physical property of the bit cell 100 according to the metal layer patterning techniques described with respect to FIGS. 2-4. For example, the physical device information 702 may include physical parameters, material characteristics, and structure information that is entered via a user interface 704 coupled to the research computer 706. The research computer 706 includes a processor 708, such as one or more processing cores, coupled to a computer-readable medium (e.g., a non-transitory computer-readable medium), such as a memory 710. The memory 710 may store computer-readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of bit cells, including the bit cell 100 according to the metal layer patterning techniques described with respect to FIGS. 2-4, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including the bit cell 100 according to the metal layer patterning techniques described with respect to FIGS. 2-4, of the library file 712. For example, a user of the design computer 714 may enter circuit design information 722 via a user interface 724 coupled to the design computer 714. The circuit design information 722 may include design information representing at least one physical property of the bit cell 100 according to the metal layer patterning techniques described with respect to FIGS. 2-4. To illustrate, the circuit design property may include identification of particular circuits and relationships to other elements in a circuit design, positioning information, feature size information, interconnection information, or other information representing a physical property of the bit cell 100 according to the metal layer patterning techniques described with respect to FIGS. 2-4.

The design computer 714 may be configured to transform the design information, including the circuit design information 722, to comply with a file format. To illustrate, the file format may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the bit cell 100 according to the metal layer patterning techniques described with respect to FIGS. 2-4, in addition to other circuits or information. To illustrate, the data file may include information corresponding to a system-on-chip (SOC) that includes the bit cell 100 according to the metal layer patterning techniques described with respect to FIGS. 2-4, and that also includes additional electronic circuits and components within the SOC.

The GDSII file 726 may be received at a fabrication process 728 to manufacture the bit cell 100 according to the metal layer patterning techniques described with respect to FIGS. 2-4, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 733, which may be tested and separated into dies, such as a representative die 736. The die 736 includes a circuit including a device that includes the bit cell 100 according to the metal layer patterning techniques described with respect to FIGS. 2-4.

For example, the fabrication process 728 may include a processor 734 and a memory 735 to initiate and/or control the fabrication process 728. The memory 735 may include executable instructions such as computer-readable instructions or processor-readable instructions. The executable instructions may include one or more instructions that are executable by a computer such as the processor 734. In a particular embodiment, the executable instructions may cause a computer to perform the method 500 of FIG. 5 or at least a portion thereof.

The fabrication process 728 may be implemented by a fabrication system that is fully automated or partially automated. For example, the fabrication process 728 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular embodiment, the fabrication process 728 corresponds to a semiconductor manufacturing process associated with a technology node smaller than 14 nm (e.g., 10 nm, 7 nm, etc.). The specific process or combination of processes used to manufacture a device (e.g., including the bit cell 100 according to the metal layer patterning techniques described with respect to FIGS. 2-4) may be based on design constraints and available materials/equipment. Thus, in particular embodiments, different processes may be used than described with reference to FIGS. 1A-7 during manufacture of the device.

As an illustrative example, a two-mask LELE process used during Vial formation for the bit cell 100 according to the metal layer patterning techniques described with respect to FIGS. 2-4 may include using a first photoresist mask to form a first pattern on a first layer (e.g., a nitride layer) of a device and etching the first pattern. A second mask may then be used to form a second pattern on the device and the combined pattern may be etched down to a second, lower layer (e.g., an oxide layer) of the device. In the combined pattern, features (e.g., lines) of the first pattern and the second pattern may be interleaved. The combined pattern may thus have smaller feature (e.g., line) pitch as compared to the first pattern and the second pattern.

As another illustrative example, a SADP process used to pattern an M1 or M2 layer of the bit cell 100 according to the metal layer patterning techniques described with respect to FIGS. 2-4 may include forming a "dummy" pattern on a device. A conforming dielectric layer may be formed (e.g., deposited) over the dummy pattern and may be etched. During etching, all of the dielectric layer except "spacers" of dielectric material adjacent to sidewalls of the dummy pattern may be removed. The dummy pattern may then be removed (e.g., without etching), leaving behind the spacers, which may form a pattern that has higher feature (e.g., line) density than the dummy pattern. The higher-density spacer pattern may be used to pattern the M1 or M2 layer.

The fabrication system (e.g., an automated system that performs the fabrication process 728) may have a distributed architecture (e.g., a hierarchy). For example, the fabrication system may include one or more processors, such as the processor 734, one or more memories, such as the memory 735, and/or controllers that are distributed according to the distributed architecture. The distributed architecture may include a high-level processor that controls or initiates operations of one or more low-level systems. For example, a high-level portion of the fabrication process 728 may include one or more processors, such as the processor 734, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 734.

Alternatively, the processor 734 may be a part of a high-level system, subsystem, or component of the fabrication system. In another embodiment, the processor 734 includes distributed processing at various levels and components of a fabrication system.

The executable instructions included in the memory 735 may enable the processor 734 to form (or initiate formation of) the bit cell 100 according to the metal layer patterning techniques described with respect to FIGS. 2-4. In a particular embodiment, the memory 735 is a non-transitory computer-readable medium storing computer-executable instructions that are executable by the processor 734 to cause the processor 734 to initiate formation of a device in accordance with the method 500 of FIG. 5. For example, the computer executable instructions may be executable to cause the processor 1034 to initiate formation of the bit cell 100 according to the metal layer patterning techniques described with respect to FIGS. 2-4. As an illustrative example, the processor 734 may initiate or control one or more of the steps of the method 500 of FIG. 5.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the bit cell 100 according to the metal layer patterning techniques described with respect to FIGS. 2-4.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the bit cell 100 according to the metal layer patterning techniques described with respect to FIGS. 2-4. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. For example, the first representative electronic device 762, the second representative electronic device 764, or both, may include or correspond to the electronic device 600 of FIG. 6, or a component thereof, such as the SRAM device 664. As an illustrative, non-limiting example, the first representative electronic device 762, the second representative electronic device 764, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 762, the second representative electronic device 764, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the bit cell 100 according to the metal layer patterning techniques described with respect to FIGS. 2-4, is integrated. As another illustrative, non-limiting example, one or more of the electronic devices 762 and 764 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes the bit cell 100 according to the metal layer patterning techniques described with respect to FIGS. 2-4, may be fabricated, processed, and incorporated into an electronic device, as described in the illustrative process 700. One or more aspects of the embodiments disclosed with respect to FIGS. 1-6 may be included at various processing stages, such as within the library file 712, the GDSII file 726 (e.g., a file having a GDSII format), and the GERBER file 752 (e.g., a file having a GERBER format), as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Although one or more of FIGS. 1A-7 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Although one or more of FIGS. 1A-7 may illustrate systems, apparatuses, and/or methods according to the teachings of the disclosure, the disclosure is not limited to these illustrated systems, apparatuses, and/or methods. One or more functions or components of any of FIGS. 1A-7 as illustrated or described herein may be combined with one or more other portions of another of FIGS. 1A-7. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   patterning a first metal layer at a bit cell;
   patterning a second metal layer between the first metal layer and a third metal layer, the second metal layer including two read word lines coupled to the bit cell; and
   patterning the third metal layer, the third metal layer including a write word line coupled to the bit cell.

2. The method of claim 1, wherein the bit cell is a three-port bit cell.

3. The method of claim 1, wherein the bit cell is manufactured using a semiconductor manufacturing process, and wherein the semiconductor manufacturing process is a sub-14 nanometer (nm) process.

4. The method of claim 3, wherein the semiconductor manufacturing process comprises a 10 nm process.

5. The method of claim 3, wherein the semiconductor manufacturing process comprises a 7 nm process.

6. The method of claim 1, wherein the first metal layer, the second metal layer, and the third metal layer are patterned using a self-aligned double patterning (SADP) process.

7. The method of claim 1, further comprising:
   forming a first via, the first via connecting the first metal layer to the second metal layer; and
   forming a second via, the second via connecting the second metal layer to the third metal layer.

8. The method of claim 1, wherein the second metal layer does not include jogs.

9. A non-transitory computer-readable medium comprising instructions that, when executed by a processor, cause the processor to:
   initiate patterning of a first metal layer at a bit cell;
   initiate patterning of a second metal layer between the first metal layer and a third metal layer, the second metal layer including two read word lines coupled to the bit cell; and
   initiate patterning of the third metal layer, the third metal layer including a write word line coupled to the bit cell.

10. The non-transitory computer-readable medium of claim 9, wherein the bit cell is a three-port bit cell.

11. The non-transitory computer-readable medium of claim 9, wherein the bit cell is manufactured using a semiconductor manufacturing process, and wherein the semiconductor manufacturing process is a sub-14 nanometer (nm) process.

12. The non-transitory computer-readable medium of claim 11, wherein the semiconductor manufacturing process comprises a 10 nm process.

13. The non-transitory computer-readable medium of claim 11, wherein the semiconductor manufacturing process comprises a 7 nm process.

14. The non-transitory computer-readable medium of claim 9, wherein the first metal layer, the second metal layer, and the third metal layer are patterned using a self-aligned double patterning (SADP) process.

15. The non-transitory computer-readable medium of claim 9, further comprising instructions that, when executed by the processor, cause the processor to:
   form a first via, the first via connecting the first metal layer to the second metal layer; and
   form a second via, the second via connecting the second metal layer to the third metal layer.

16. The non-transitory computer-readable medium of claim 9, wherein the second metal layer does not include jogs.

17. The non-transitory computer-readable medium of claim 9, wherein the bit cell is included in a static random access memory (SRAM) device.

* * * * *